(12) United States Patent
Du (10) Patent No.: US 6,717,839 B1
(45) Date of Patent: Apr. 6, 2004

(54) BIT-LINE SHIELDING METHOD FOR FERROELECTRIC MEMORIES (75) Inventor: Xiao Hong Du, Colorado Springs, CO (US)

(73) Assignee: Ramtron International Corporation, Colorado Springs, CO (US)

(*) Notice: Subject to any disclaimer, the term of this patent is extended or adjusted under 35 U.S.C. 154(b) by 0 days.

(21) Appl. No.: 10/404,941

(22) Filed: Mar. 31, 2003

(51) Int. Cl.[7] .............................................. G11C 11/22
(52) U.S. Cl. .................. 365/145; 365/189.09; 365/210; 365/63
(58) Field of Search ........................... 365/145, 189.09, 365/210, 63

(56) References Cited

U.S. PATENT DOCUMENTS

| | | |
|---|---|---|
| 5,010,524 A | 4/1991 | Fifield et al. |
| 5,424,235 A | 6/1995 | Nishihara |
| 5,940,321 A | 8/1999 | Takeuchi et al. |
| 6,137,711 A * | 10/2000 | Tan .............................. 365/145 |
| 6,188,598 B1 * | 2/2001 | Mueller et al. ................ 365/69 |
| 6,205,044 B1 | 3/2001 | Feurle et al. |
| 6,310,399 B1 | 10/2001 | Feurle et al. |
| 6,344,990 B1 | 2/2002 | Matsumiya et al. |
| 6,370,078 B1 | 4/2002 | Wik et al. |
| 6,459,609 B1 | 10/2002 | Du |

* cited by examiner

Primary Examiner—Vu A. Le
(74) Attorney, Agent, or Firm—Hogan & Hartson L.L.P.

(57) ABSTRACT

A bit-line shielding technique for a ferroelectric memory logically divides the bit-lines in the array into two groups. When the bit-lines in one of the groups are accessed, the bit-lines in the other group are not accessed and thus can be grounded to electrically shield the bit-lines being accessed. Each group of bit-lines is coupled to the drains of a group of pre-charge devices at the bottom of the array. The sources of the pre-charge devices are grounded. The word lines are arranged so that only the bit-lines in one of the groups are accessed at a time.

24 Claims, 6 Drawing Sheets

BIT-LINE SHIELDING METHOD FOR FERROELECTRIC MEMORIES

BACKGROUND

1. Field of the Invention

This invention is related to ferroelectric memories, and, more particularly to a bit-line shielding method specifically adapted for ferroelectric memory architectures.

2. Background of the Invention

Capacitive coupling among bit-lines is one of the major noise sources in a semiconductor memory such as a ferroelectric memory. This coupling sometimes is so strong that it causes read fails if no appropriate measure is taken. There are typically two conventional methods to solve this problem. The first method is twisting the bit-lines to reduce coupling. The second method is adding an additional shielding metal line between each pair of bit-lines.

Bit-line twisting has several disadvantages. Bit-line twisting is most effective when the twisted bit-lines carry electrically complementary signals. Thus, the effect of bit-line twisting is data dependent and the coupling is random, increasing the difficulty of the reference design. Coupling among bit-lines can only be balanced by bit-line twisting, but not eliminated. Bit-line twisting complicates layout and increases the imbalance between the bit-line and the electrically complementary bit-line.

The disadvantage of conventional bit-line shielding is that extra lines are added to the memory core; thus the die efficiency is reduced.

What is desired is a compact bit-line shielding technique that is specifically suited to both referenced and self-referenced ferroelectric memories.

SUMMARY OF THE INVENTION

A bit-line shielding technique for a ferroelectric memory logically divides the bit-lines in the array into two groups. In a preferred mode of operation, only bit-lines in one of the groups are accessed at a time. When the bit-lines in one of the groups are accessed, the bit-lines in the other group are not accessed and thus can be grounded to electrically shield the bit-lines being accessed. Each group of bit-lines is coupled to the drains of a group of pre-charge devices at the bottom of the array. The sources of the pre-charge devices are grounded. The word lines are arranged so that only the bit-lines in one of the groups are accessed at a time. Thus, when the bit-lines in one group are accessed, those on the other group can be grounded to shield the bit-lines being accessed by controlling the state of the pre-charge devices. One dummy bit-line, which is always grounded, is put on each side of the array segment. In this way, each bit-line can be shielded by two grounded lines on both of its sides when accessed.

The bit-line shielding technique of the present invention can be expanded by logically dividing the bit-lines into three or more sub-groups if desired. The minimum useful grouping includes two bit-lines, so that at least one accessed bit-line can be shielded. During a memory access, some of the groups are accessed and others are not as desired. The bit-lines in the groups which are not accessed are grounded to shield the bit-lines in the groups being accessed.

It is an advantage of the invention that each bit-line is shielded by grounding two unused bit-lines on each side. The coupling among the bit-lines is essentially eliminated without adding extra metal shielding lines so the physical layout of the ferroelectric memory array is simpler than bit-line twisting.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF THE INVENTION

Figure 1:
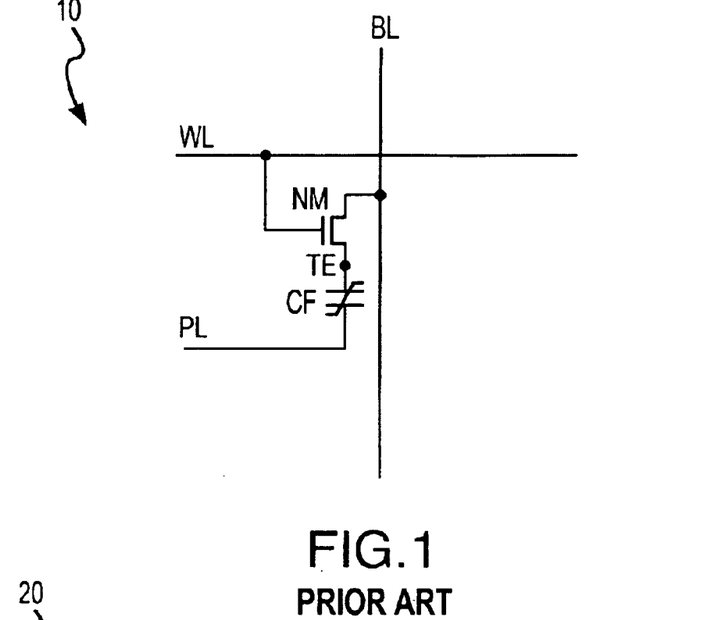
FIG. 1 is a schematic of a prior art 1T/1C ferroelectric memory cell.

Referring now to FIG. 1, a typical prior art 1T/1C ferroelectric memory cell 10 is shown. The various signals and elements of the memory cell 10 are shown wherein WL is a word line, BL is a bit-line, NM is an NMOS transistor, CF is a ferroelectric capacitor, TE is the top electrode of capacitor CF (also sometimes known as the "internal" node of the memory cell), and PL is a plate line which is connected to the bottom electrode of capacitor CF. A ferroelectric capacitor such as capacitor CF retains a remnant polarization inside the capacitor even when the voltage across the capacitor is removed. Thus, memory cell 10 is non-volatile, unlike conventional DRAM cell. During a read operation, WL is pulled high and NM is turned on to select the desired memory cell. Then, PL is pulled high to interrogate the ferroelectric capacitor CF. The output charge from capacitor CF is different during plate pulsing, based on the previous direction or "state" of the remnant polarization. The output charge is translated to a bit-line voltage which is compared with a reference to determine the current stored data state.

Figure 2:
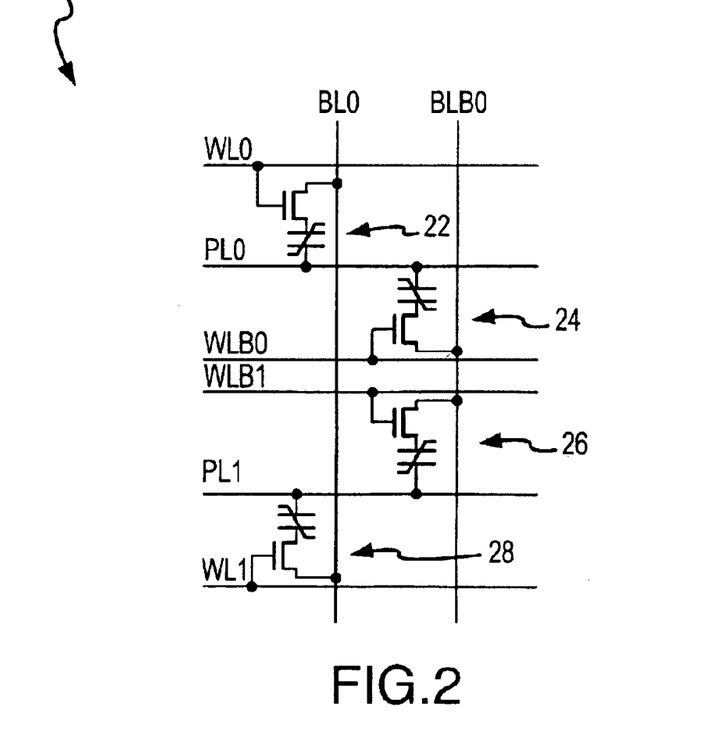
FIG. 2 is a schematic of four 1T/1C ferroelectric memory cells in which the position of the memory cells in the schematic roughly correspond to their physical positions in a chip layout.

A portion 20 of a 1T/1C memory array used in conjunction with the bit-line shielding technique of the present invention is shown in FIG. 2. The array portion 20 is repeated both in columns and rows to constitute a complete array segment of desired size. Portions of the bit-lines, word lines, and plate lines are shown, that are also extended in a complete array segment. A first memory cell 22 is coupled to first word line row portion WL0, the first plate line row portion PL0, and the bit-line column portion BL0. A second memory cell 24 is coupled to the first complementary word line row portion WLB0, the first plate line row portion PL0, and the complementary bit-line column portion BLB0. A third memory cell 26 is coupled to the second complementary word line row portion WLB1, the second plate line row portion PL1, and the complementary bit-line column portion BLB0. A fourth memory cell 28 is coupled to the second word line row portion WL1, the second plate line row portion PL1, and the bit-line column portion BL0.

In the present specification, the term "complementary (bit-line or word line)" is used primarily to denote a physical association with a "non-complementary (bit-line or word line)" in the sense of physical proximity or grouping and is not meant to necessarily designate electrically complementary signals carried on those lines.

Figure 3:
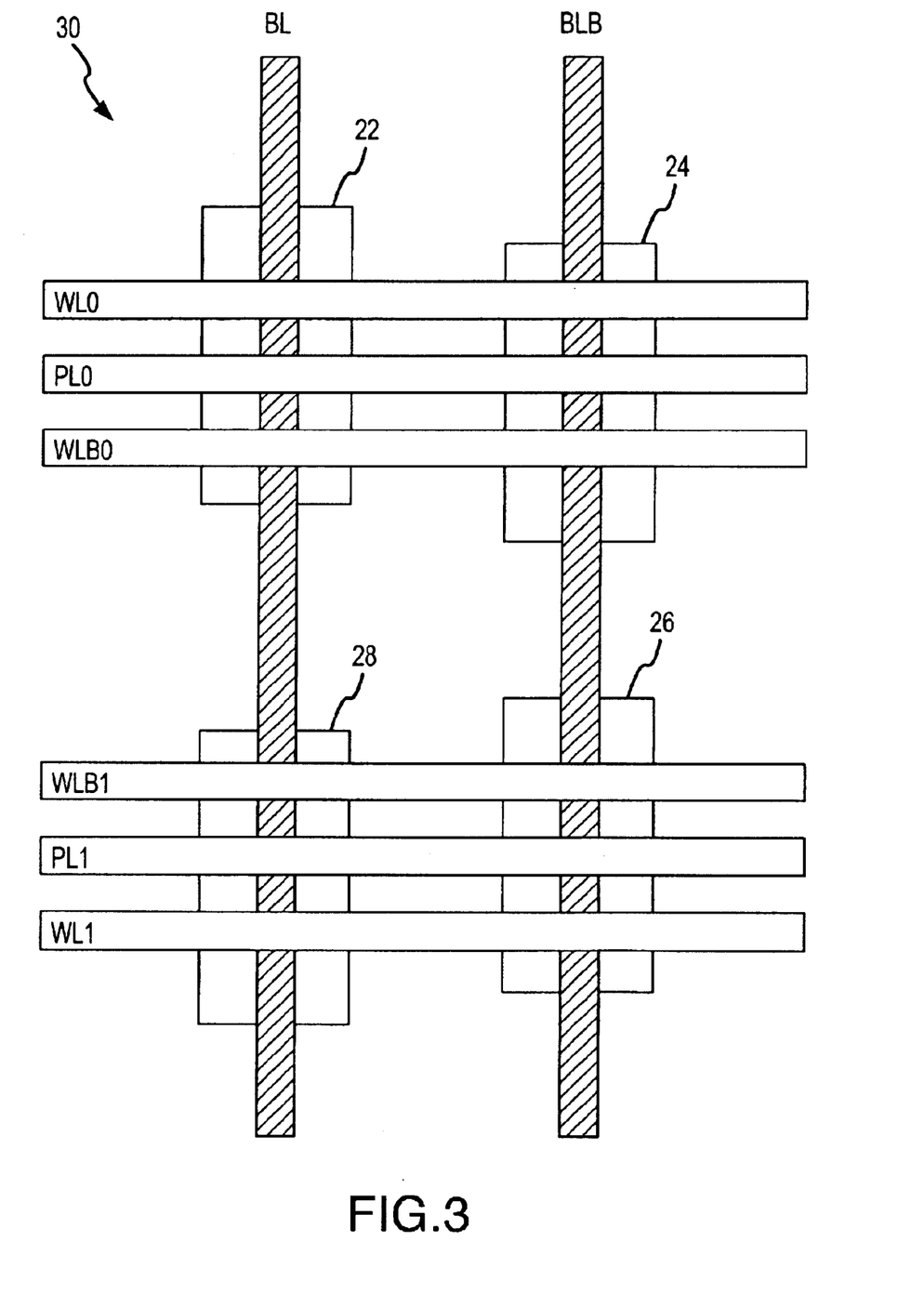
FIG. 3 is a plan view of a chip layout corresponding to the four 1T/1C memory cells of FIG. 2 wherein four word lines and two plate lines cross two bit-lines in the specific manner shown.

Referring now to FIG. 3, the layout of the memory cells of FIG. 2 is shown in which memory cells 22, 24, 26, and 28 are arranged into a repeating physical layout pattern of four 1T/1C ferroelectric memory cells. The first word line row portion WL0, the first plate line row portion PL0, the first complementary word line row portion WLB0, the second complementary word line row portion WLB1, the second plate line row portion PL1, and the second word line row portion WL1 are all parallel to and laterally spaced apart on the layout in listed order. The bit-line column portion BL and the complementary bit-line column portion BLB are parallel to and laterally spaced apart on the layout. The appropriate connections from the bit-lines, word lines, and plate lines to the corresponding memory cells are made as is desired, and are not shown in FIG. 3.

Figure 4:
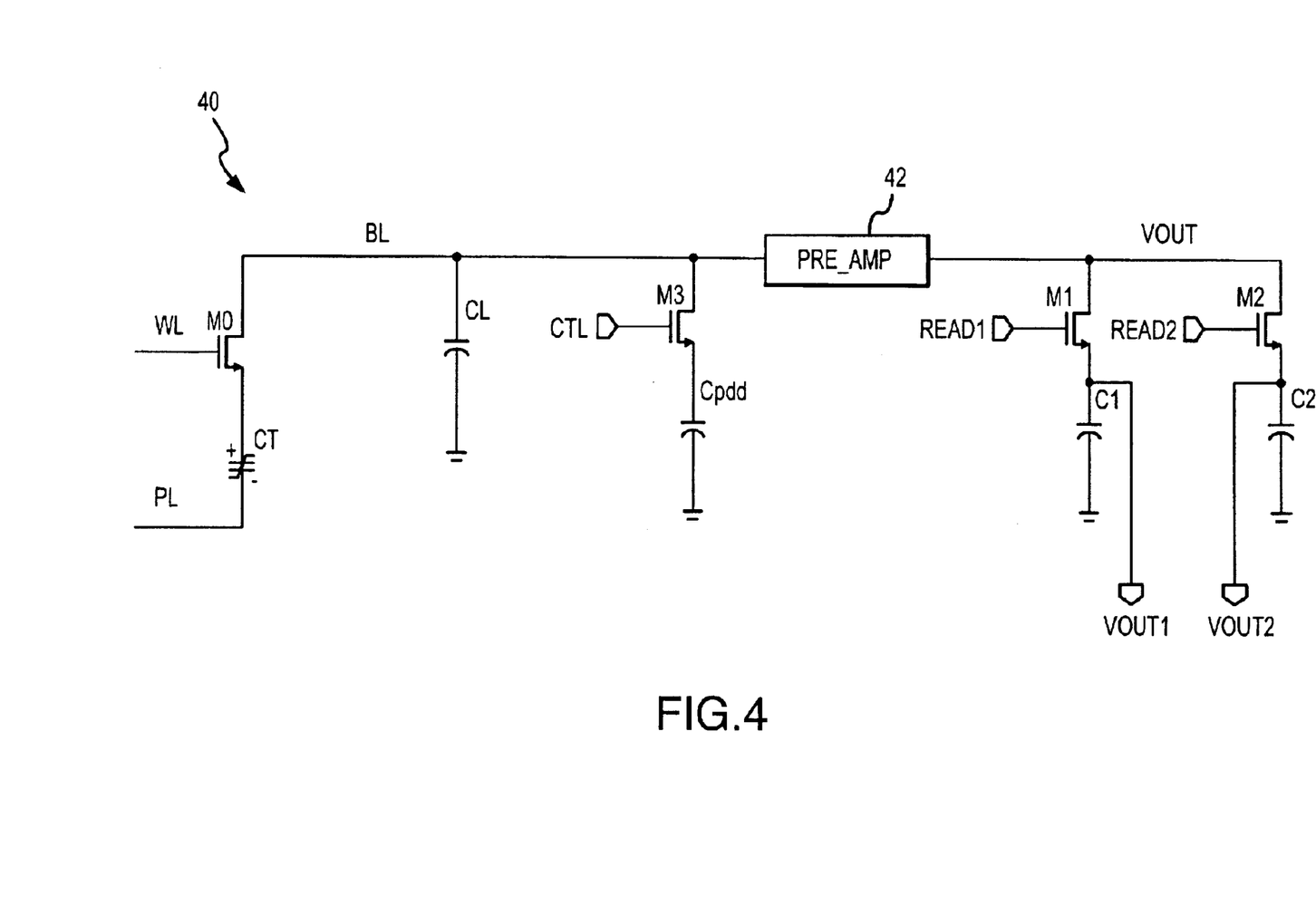
FIG. 4 is a schematic of a self-referencing scheme with preamplifiers for a ferroelectric memory array.

Referring now to FIG. 4, the bit-line shielding method of the present invention is adapted for use in a self-referencing 1T/1C ferroelectric random access memory. This self-referencing ferroelectric memory is disclosed in further detail in U.S. Pat. No. 6,459,609 B1, which is hereby incorporated by reference. FIG. 4 illustrates the self-referencing scheme 40 with preamplifier 42. In the self-referencing scheme, the polarization state in a given 1T/1C memory cell (M0, CF) in an array is determined by applying two consecutive plate line pulses on the ferroelectric capacitor CF in the memory cell. The bit-line voltages corresponding to these two plate line pulses are pre-amplified by preamplifier 42. The output voltage VOUT is sampled and held to generate output voltages VOUT1 and VOUT2. These voltages are coupled to a sense amplifier, which is not shown in FIG. 4. One of the advantages to the self-referencing scheme shown in FIG. 4 is that no standalone reference needed. When one memory cell is accessed, all the signals needed to resolve the data state in the cell go to the same single bit-line associated with the memory cell. Thus, in the case of a self-referenced 1T/1C ferroelectric memory array, the bit-lines on both sides of a bit-line being accessed can be grounded to shield the bit-line being accessed.

Figure 5:
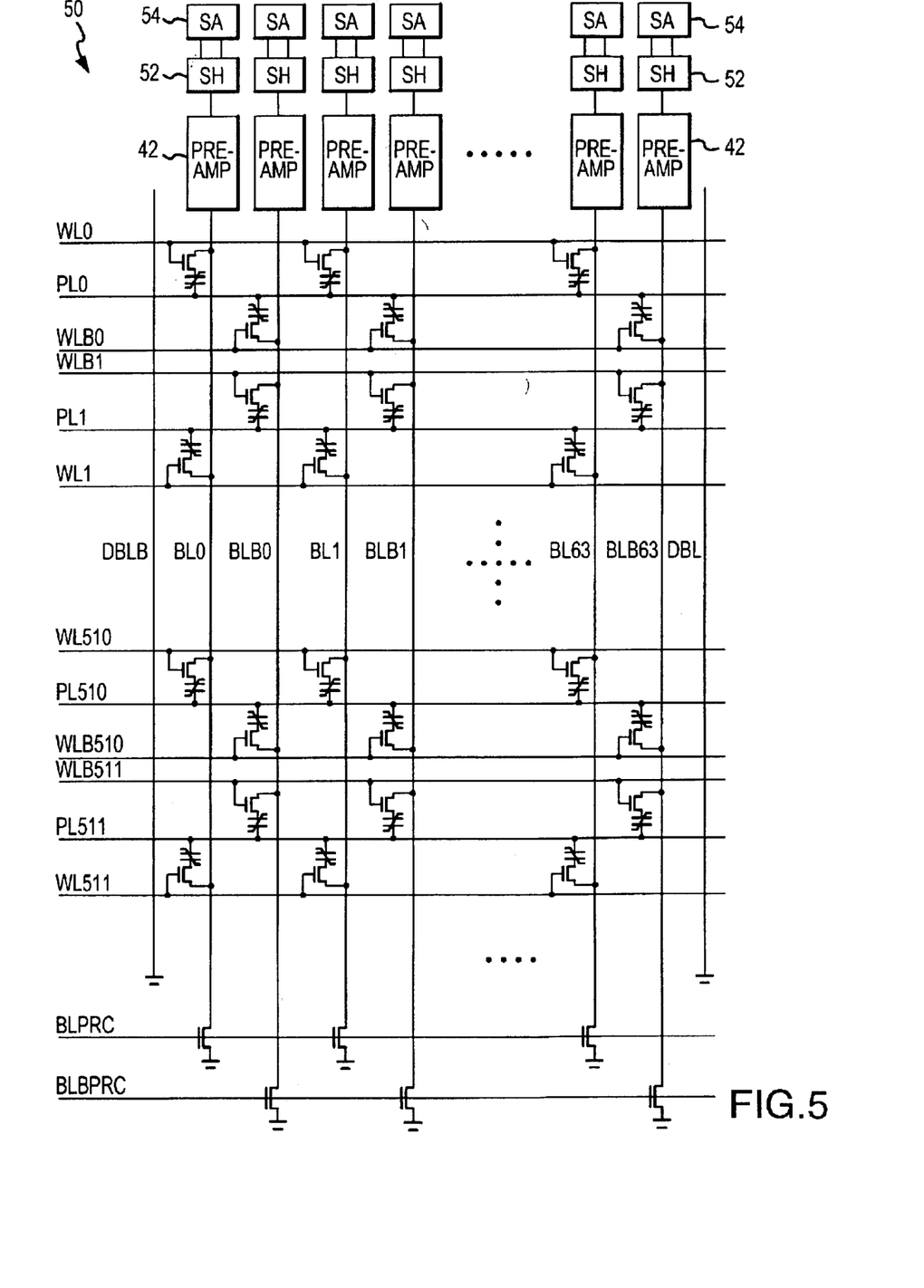
FIG. 5 is a schematic of a portion of a self-referencing 1T/1C ferroelectric memory array incorporating the preferred bit-line shielding method of the present invention.

Referring now to FIG. 5, a self-referenced ferroelectric memory 50 including bit-line shielding according to the present invention includes an array of 1T/1C ferroelectric memory cells including a word line node, a bit-line node, and a plate line node. A plurality of bit-line columns BL0 through BL63 are continuous from a lower end to an upper end in the array, and are coupled to the bit-line node of a first subset of the 1T/1C ferroelectric memory cells. The first subset of memory cells in FIG. 5 refers to the memory cells coupled to the bit-line columns BLx. A plurality of interleaved complementary bit-line columns BLB0 through BLB63 are also continuous from a lower end to an upper end in the array, and are coupled to the bit-line node of a second subset of 1T/1C ferroelectric memory cells. The second subset of memory cells in FIG. 5 refers to the memory cells coupled to the complementary bit-line columns, BLBx.

Still referring to FIG. 5, a plurality of word line rows WL0 though WL511 are coupled to the word line nodes of the first subset of 1T/1C ferroelectric memory cells. The first subset of memory cells in FIG. 5 refers to the memory cells coupled to the "non-complementary" word line rows and bit-lines. A plurality of plate line rows PL0 through PL511 are coupled to the plate line nodes of the 1T/1C ferroelectric memory cells. A plurality of interleaved complementary word line rows WLB0 through WLB 511 are coupled to the word line nodes of the second subset of 1T/1C ferroelectric memory cells. The second subset of memory cells in FIG. 5 refers to the memory cells coupled to the complementary word line rows and the complementary bit-line columns.

Since memory 50 is a "self-referenced" ferroelectric memory, a pre-amplifier 42 is coupled to each of the upper ends of the bit-line columns and the complementary bit-line columns. A sample and hold circuit 52 is coupled to each of the preamplifiers 42. A sense amplifier 54 is coupled to each of the sample and hold circuits 52. A first group of parallel NMOS transistors for grounding at least two adjacent bit-line columns in a first operational mode is coupled to the lower end of the bit-line columns. The sources of the transistors are coupled to ground and the gates are coupled together for receiving the BLPRC control signal. (Bit-Line Pre-Charge Control). A second group of parallel NMOS transistors for grounding at least two adjacent complementary bit-line columns in a second operational mode is coupled to the lower end of the complementary bit-line columns. The sources of the. transistors are coupled to ground and the gates are coupled together for receiving the BLBPRC control signal. (Bit-Line Bar Pre-Charge Control).

Figure 6:
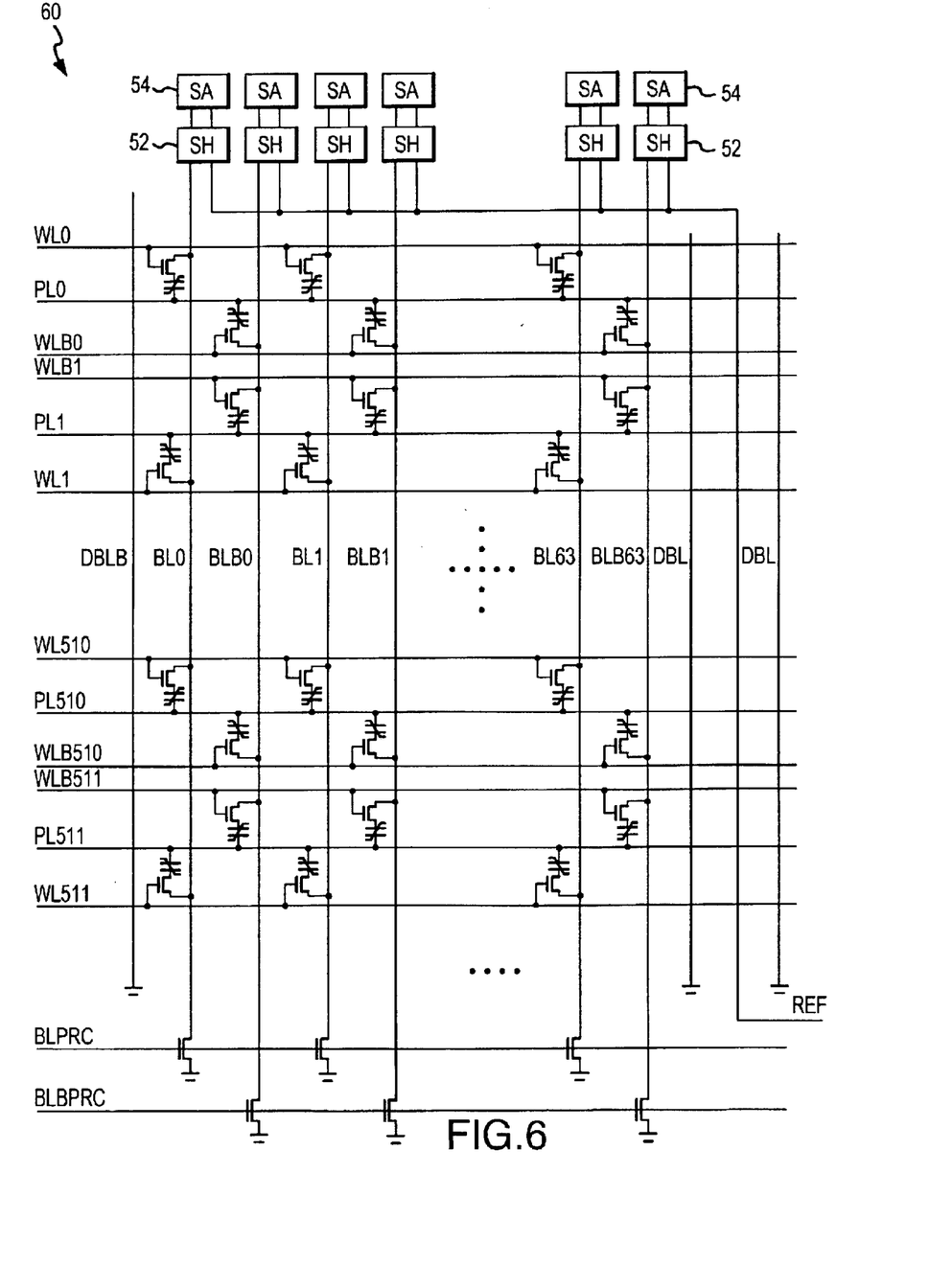
FIG. 6 is a schematic of a portion of a referenced 1T/1C ferroelectric memory array incorporating the preferred bit-line shielding method of the present invention.

Referring now to FIG. 6, a ferroelectric memory 60 including a reference and bit-line shielding according to the present invention includes an array of 1T/1C ferroelectric memory cells including a word line node, a bit-line node, and a plate line node. A plurality of bit-line columns BL0 through BL63 having a lower end and an upper end is coupled to the bit-line node of a first subset of the 1T/1C ferroelectric memory cells. A plurality of interleaved complementary bit-line columns BLB0 through BLB63 having a lower end and an upper end is coupled to the bit-line node of a second subset of 1T/1C ferroelectric memory cells. A plurality of word line rows WL0 through WL511 is coupled to the word line nodes of the first subset of 1T/1C ferroelectric memory cells. A plurality of plate line rows PL0 through PL511 is coupled to the plate line nodes of the 1T/1C ferroelectric memory cells. A plurality of interleaved complementary word line rows WLB0 though WLB511 is coupled to the word line nodes of the second subset of 1T/1C ferroelectric memory cells.

A sample and hold circuit 52 is coupled to each of the bit-line columns and complementary bit-line columns. A sense amplifier 54 is coupled to each of the sample and hold circuits 52. A reference column line REF is coupled to each of the sample and hold circuits 52.

As in FIG. 5, a first group of parallel NMOS transistors coupled to the BLPRC control signal is used for grounding at least two adjacent bit-line columns in a first operational mode, coupled to the lower end of the bit-line columns. A second group of parallel NMOS transistors coupled to the BLBPRC control signal is used for grounding at least two adjacent complementary bit-line columns in a second operational mode, coupled to the lower end of the complementary bit-line columns.

The repeating physical layout pattern for four 1T/1C ferroelectric memory cells in FIGS. 5 and 6 is the same as that described with respect to FIGS. 2 and 3.

With respect to memories 50 and 60 shown in FIGS. 5 and 6, a preferred first operational mode includes grounding all of the bit-line columns by taking the BLPRC signal high. This action isolates all of the complementary bit-line columns, and any memory cell coupled to a complementary bit-line column can be accessed. A preferred second operational mode includes grounding all of the complementary bit-line columns by taking the BLBPRC signal high. This action isolates all of the bit-line columns, and any memory cell coupled to a bit-line column can be accessed.

Also with respect to memories 50 and 60 shown in FIGS. 5 and 6, first and second dummy bit-line columns DBL and DBLB are placed on either end of the memory array segment as shown. Ideally, the first and second dummy bit-line columns DBL and DBLB are coupled to ground.

Referring now to FIG. 6, memory 60 further includes a third dummy bit-line column DBL on either end of the memory array segment. The reference column line REF is then physically located between the third dummy bit-line and either the first or second dummy bit-lines. Ideally, the third dummy bit-line DBL is also coupled to ground so that the reference column line REF is electrically isolated.

Figure 7:
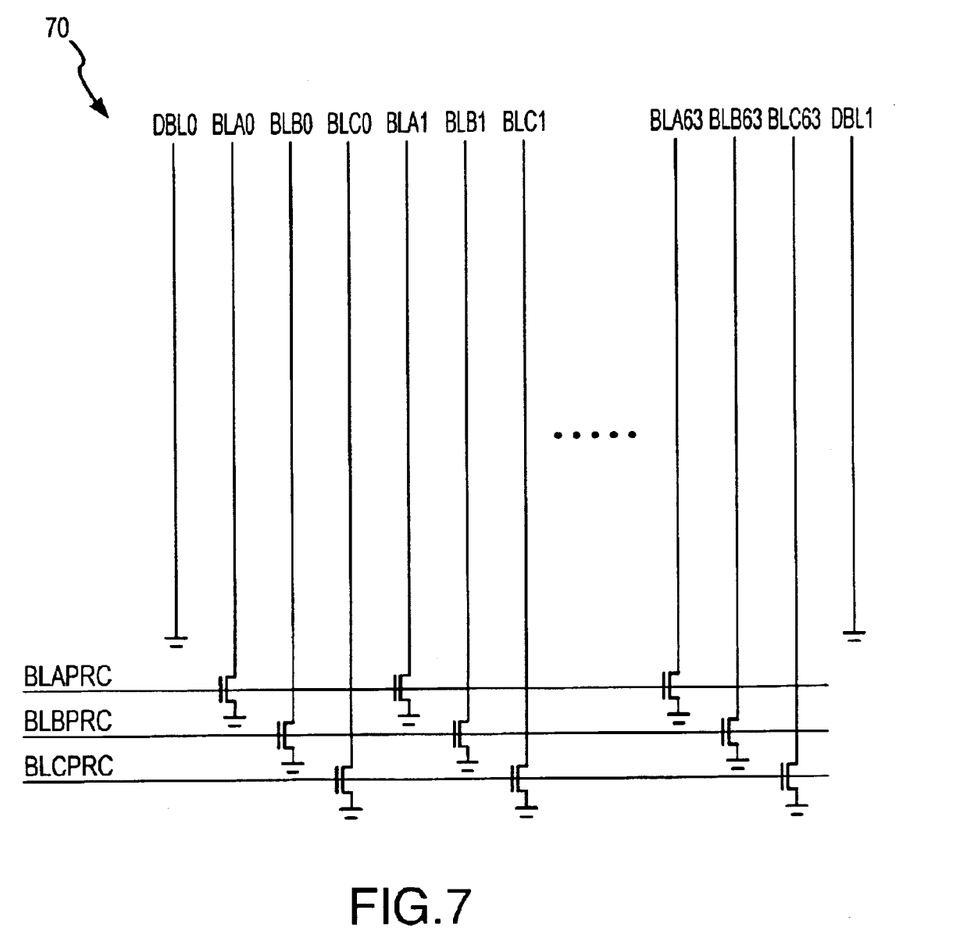
FIG. 7 is a schematic showing bit-lines and grounding transistors for the selective bit-line shielding of three or more portions of the memory array according to an alternative embodiment of the present invention.

In the bit-line shielding method described above, bit-lines are grouped into two groups BLx and BLBx. The two groups are interleaved with each other. The word lines are arranged in such a way that only the bit-lines in one of the groups are accessed at a time. The bit-lines in the other group are grounded to shield the bit-lines being accessed. The previously described bit-line shielding method of the present invention can be generalized such that more than two interleaved groups of bit-lines can be shielded. The bit-lines are grouped into N groups and the word lines are arranged in such a way that only bit-lines in some of the groups are accessed at a given time. The bit-lines in the other groups are grounded to shield the bit-lines being accessed. FIG. 7 illustrates a bit-line shielding method with three groups of bit-lines. The bit-lines are divided into three groups, BLAx, BLBx, and BLCx. Each group has its own corresponding bit-line precharge control and precharge devices. The NMOS transistors having a common gate node controlled by the BLAPRC signal form a first group of precharge devices, the NMOS transistors having a common gate node controlled by the BLBPRC signal form a second group of precharge devices, and the NMOS transistors having a common gate node controlled by the BLCPRC signal form a third group of precharge devices. Only bit-lines in one or two of the groups are accessed at a time and the bit-lines in the rest groups or group are grounded to shield the bit-lines being accessed. For example, when the bit-lines in group A and group C are accessed, the bit-lines in group B are grounded by taking BLBPRC high to shield the bit-lines being accessed. Similarly, when the bit-lines in group A are accessed, the bit-lines in groups B and C are grounded to shield the bit-lines being accessed. In general, the bit-lines can be divided into any number of groups and a desired shielding scheme can be realized by arranging the bit-line precharge control and the word line decode. The arrangement of word lines to accommodate the shielding scheme is not shown in FIG. 7. Dividing the bit-lines into multi-groups provides flexibility in the memory architectures with the bit-line shielding scheme of the present invention.

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A self-referenced ferroelectric memory including bit-line shielding comprising:

an array of 1T/1C ferroelectric memory cells including a word line node, a bit-line node, and a plate line node;

a plurality of bit-line columns having a lower end and an upper end, coupled to the bit-line node of a first subset of the 1T/1C ferroelectric memory cells;

a plurality of interleaved complementary bit-line columns having a lower end and an upper end, coupled to the bit-line node of a second subset of 1T/1C ferroelectric memory cells;

a plurality of word line rows coupled to the word line nodes of the first subset of 1T/1C ferroelectric memory cells;

a plurality of plate line rows coupled to the plate line nodes of the 1T/1C ferroelectric memory cells;

a plurality of interleaved complementary word line rows coupled to the word line nodes of the second subset of 1T/1C ferroelectric memory cells;

a pre-amplifier coupled to each of the upper end of the bit-line columns and complementary bit-line columns;

a sample and hold circuit coupled to each of the preamplifiers;

a sense amplifier coupled to each of the sample and hold circuits;

means for grounding at least two adjacent bit-line columns in a first operational mode, coupled to the lower end of the bit-line columns; and means for grounding at least two adjacent complementary bit-line columns in a second operational mode, coupled to the lower end of the complementary bit-line columns.

2. The memory of claim 1 in which the memory cells are arranged into a repeating physical layout pattern of four 1T/1C ferroelectric memory cells comprising:

a first word line row portion, a first plate line row portion, a first complementary word line row portion, a second complementary word line row portion, a second plate line row portion, and a second word line row portion, wherein each of the row and plate line portions are parallel to and laterally spaced apart on the layout in listed order;

a bit-line column portion and a complementary bit-line column portion parallel to and laterally spaced apart on the layout;

a first memory cell coupled to first word line row portion, the first plate line row portion, and the bit-line column portion;

a second memory cell coupled to the first complementary word line row portion, the first plate line row portion, and the complementary bit-line column portion;

a third memory cell coupled to the second complementary word line row portion, the second plate line row portion, and the complementary bit-line column portion; and a fourth memory cell coupled to the second word line row portion, the second plate line row portion, and the bit-line column portion.

3. The memory of claim 1 in which the means for grounding at least two adjacent bit-line columns in a first operational mode comprises means for grounding all of the bit-line columns in the first operational mode.

4. The memory of claim 1 in which the means for grounding at least two adjacent bit-line columns in a first operational mode comprises means for grounding at least two adjacent bit-line columns while at least one memory cell coupled to an interleaved complementary bit-line column is being accessed.

5. The memory of claim 1 in which the means for grounding at least two adjacent bit-line columns in a first operational mode comprises at least two parallel N-channel transistors each having a gate for receiving a common control signal, a drain coupled to the lower end of a corresponding bit-line column, and a source coupled to ground.

6. The memory of claim 1 in which the means for grounding at least two adjacent complementary bit-line columns in a second operational mode comprises means for grounding all of the complementary bit-line columns.

7. The memory of claim 1 in which the means for grounding at least two adjacent complementary bit-line columns in a second operational mode comprises means for grounding at least two adjacent complementary bit-line columns while at least one memory cell coupled to an interleaved bit-line column is being accessed.

8. The memory of claim 1 in which the means for grounding at least two adjacent complementary bit-line columns in a second operational mode comprises at least two parallel N-channel transistors each having a gate for receiving a common control signal, a drain coupled to the lower end of a corresponding complementary bit-line column, and a source coupled to ground.

9. The memory of claim 1 further comprising first and second dummy bit-line columns placed on either end of the memory array segment.

10. The memory of claim 9 in which the first and second dummy bit-line columns are coupled to ground.

11. A ferroelectric memory including a reference and bit-line shielding comprising:

an array of 1T/1C ferroelectric memory cells including a word line node, a bit-line node, and a plate line node;

a plurality of bit-line columns having a lower end and an upper end, coupled to the bit-line node of a first subset of the 1T/1C ferroelectric memory cells;

a plurality of interleaved complementary bit-line columns having a lower end and an upper end, coupled to the bit-line node of a second subset of 1T/1C ferroelectric memory cells;

a plurality of word line rows coupled to the word line nodes of the first subset of 1T/1C ferroelectric memory cells;

a plurality of plate line rows coupled to the plate line nodes of the 1T/1C ferroelectric memory cells;

a plurality of interleaved complementary word line rows coupled to the word line nodes of the second subset of 1T/1C ferroelectric memory cells;

a sample and hold circuit coupled to the upper end of each of the bit-line columns and complementary bit-line columns;

a sense amplifier coupled to each of the sample and hold circuits;

a reference column line coupled to each of the sample and hold circuits;

means for grounding at least two adjacent bit-line columns in a first operational mode, coupled to the lower end of the bit-line columns; and means for grounding at least two adjacent complementary bit-line columns in a second operational mode, coupled to the lower end of the complementary bit-line columns.

12. The memory of claim 11 in which the memory cells are arranged into a repeating physical layout pattern of four 1T/1C ferroelectric memory cells comprising:

a first word line row portion, a first plate line row portion, a first complementary word line row portion, a second complementary word line row portion, a second plate line row portion, and a second word line row portion, wherein each of the row and plate line portions are parallel to and laterally spaced apart on the layout in listed order;

a bit-line column portion and a complementary bit-line column portion parallel to and laterally spaced apart on the layout;

a first memory cell coupled to first word line row portion, the first plate line row portion, and the bit-line column portion;

a second memory cell coupled to the first complementary word line row portion, the first plate line row portion, and the complementary bit-line column portion;

a third memory cell coupled to the second complementary word line row portion, the second plate line row portion, and the complementary bit-line column portion; and a fourth memory cell coupled to the second word line row portion, the second plate line row portion, and the bit-line column portion.

13. The memory of claim 11 in which the means for grounding at least two adjacent bit-line columns in a first operational mode comprises means for grounding all of the bit-line columns in the first operational mode.

14. The memory of claim 11 in which the means for grounding at least two adjacent bit-line columns in a first operational mode comprises means for grounding at least two adjacent bit-line columns while at least one memory cell coupled to an interleaved complementary bit-line column is being accessed.

15. The memory of claim 11 in which the means for grounding at least two adjacent bit-line columns in a first operational mode comprises at least two parallel N-channel transistors each having a gate for receiving a common control signal, a drain coupled to the lower end of a corresponding bit-line column, and a source coupled to ground.

16. The memory of claim 11 in which the means for grounding at least two adjacent complementary bit-line columns in a second operational mode comprises means for grounding all of the complementary bit-line columns.

17. The memory of claim 11 in which the means for grounding at least two adjacent complementary bit-line columns in a second operational mode comprises means for grounding at least two adjacent complementary bit-line columns while at least one memory cell coupled to an interleaved bit-line column is being accessed.

18. The memory of claim 11 in which the means for grounding at least two adjacent complementary bit-line columns in a second operational mode comprises at least two parallel N-channel transistors each having a gate for receiving a common control signal, a drain coupled to the lower end of a corresponding complementary bit-line column, and a source coupled to ground.

19. The memory of claim 11 further comprising first and second dummy bit-line columns placed on either end of the memory array.

20. The memory of claim 19 in which the first and second dummy bit-line columns are coupled to ground.

21. The memory of claim 19 further comprising a third dummy bit-line on either end of the memory array.

22. The memory of claim 21 wherein the reference column line is physically located between the third dummy bit-line and either the first or second dummy bit-lines.

23. The memory of claim 21 in which the third dummy bit-line is coupled to ground.

24. A bit-line shielding method comprising:

dividing a ferroelectric memory array into three or more groups of independently controllable interleaved bit-lines;

accessing a ferroelectric memory cell coupled to one of the groups of interleaved bit-lines; and grounding the bit-lines in all of the other groups of interleaved bit-lines, so that each accessed memory cell is electrically isolated by at least two sets of bit-lines on either side of the selected ferroelectric memory cell.

* * * * *